(12) United States Patent
Nagasue

(10) Patent No.: US 6,687,155 B2
(45) Date of Patent: Feb. 3, 2004

(54) ANALOG STORAGE SEMICONDUCTOR MEMORY THAT USES PLURAL WRITE VOLTAGES AND PLURAL READ VOLTAGES HAVING DIFFERENT VOLTAGE LEVELS

(75) Inventor: Makoto Nagasue, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/434,217

(22) Filed: May 9, 2003

(65) Prior Publication Data

US 2003/0193825 A1 Oct. 16, 2003

Related U.S. Application Data

(63) Continuation-in-part of application No. 09/874,987, filed on Jun. 7, 2001, now abandoned.

(30) Foreign Application Priority Data

Jan. 11, 2001 (JP) ........................................ 2001/003600

(51) Int. Cl.[7] .............................................. G11C 16/12
(52) U.S. Cl. ........................ 365/185.03; 365/185.19; 365/185.22; 365/185.2; 365/185.33; 365/45; 365/189.09; 365/189.11
(58) Field of Search .................... 365/185.03, 185.33, 365/185.19, 185.2, 185.22, 45, 168, 189.09, 189.11

(56) References Cited

U.S. PATENT DOCUMENTS

| | | | |
|---|---|---|---|
| 4,890,259 A | 12/1989 | Simko | 365/45 |
| 4,989,179 A | 1/1991 | Simko | 365/45 |
| 5,126,967 A | 6/1992 | Simko | 365/45 |
| 5,241,494 A | 8/1993 | Blyth et al. | 365/45 |
| 5,289,401 A | 2/1994 | Shima | 365/45 |
| 5,903,487 A | 5/1999 | Wu et al. | 365/45 |
| 5,963,462 A | 10/1999 | Engh et al. | 365/45 |
| 5,986,930 A | 11/1999 | Yoshikawa et al. | 365/185.03 |
| 6,288,934 B1 | 9/2001 | Aikawa | 365/185.03 |
| 6,434,051 B1 | 8/2002 | Endo | 365/185.21 |

*Primary Examiner*—Andrew Q. Tran
(74) *Attorney, Agent, or Firm*—Volentine Francos, PLLC

(57) ABSTRACT

An analog storage flash memory by which sufficient write accuracy can be obtained even when the write speed of the memory cell transistor disperses due to manufacturing dispersion or other reasons. A read voltage adjustment circuit outputs the read voltage generated by a read voltage generation circuit as is, or drops and outputs the read voltage. A write voltage adjustment circuit outputs the write voltage generated by a write voltage generation circuit as is, or drops and outputs the write voltage. A write control circuit repeats the write operation at the write voltage Vw until the memory cell transistor turns OFF at the read voltage $Vr-\Delta Vr$ in the first write cycle, and repeats the write operation at the write voltage $Vw-\Delta Vw$ until the memory transistor turns OFF at the read voltage Vr in the second write cycle.

25 Claims, 2 Drawing Sheets

ANALOG STORAGE SEMICONDUCTOR MEMORY THAT USES PLURAL WRITE VOLTAGES AND PLURAL READ VOLTAGES HAVING DIFFERENT VOLTAGE LEVELS

CROSS REFERENCE TO RELATED APPLICATIONS

This is a continuation-in-part application of application Ser. No. 09/874,987, filed Jun. 7, 2001, now abandoned, which is hereby incorporated by reference in its entirety for all purposes.

BACKGROUND OF THE INVENTION

1. Field of the Invention

The present invention relates to a rewritable semiconductor memory such as a flash memory, and more particularly to a technology for writing an analog value to a memory cell transistor of a semiconductor memory.

2. Description of Related Art

As a conventional memory, an analog storage flash memory, for example, is known. An analog storage flash memory is a flash memory where an analog value can be written to a memory cell by the analog controlling of charge amount stored in a floating gate. An analog storage flash memory is used for the internal memory of a LSI (Large Scale Integrated Circuit) for reproducing a recorded sound.

The downside of an analog storage flash memory is that a sufficient writing accuracy cannot be obtained when the dispersion of writing characteristics of the memory cell transistor is high. In a memory cell transistor, the writing speed disperses due to manufacturing dispersion and for other reasons, so if the writing speed of the memory cell transistor is very fast, the rise of the ON/OFF threshold value per one writing becomes very high, and the actual ON/OFF threshold value obtained by writing may exceed a desired setup value considerably.

SUMMARY OF THE INVENTION

It is an object of the present invention to provide an analog storage semiconductor memory which writing accuracy is sufficiently high.

In this, in accordance with the first standpoint of the present invention, an analog storage semiconductor memory according to the present invention includes a memory cell driver for storing an analog data to a memory cell transistor by setting an operation threshold voltage of the memory cell transistor based on the voltage corresponding to the analog data, wherein the setting is executed by supplying an analog voltage with decreasing voltage as the operation threshold voltage approaches the voltage corresponding to the analog data, to a control gate of the memory cell transistor.

Moreover, in accordance with the second standpoint of the present invention, an analog storage semiconductor memory according to the present invention includes a write voltage supply circuit for supplying a plurality of types of write voltage to a control gate of a memory cell transistor; a read voltage supply circuit for supplying a plurality of types of read voltage to the control gate of the memory cell transistor; and a write control circuit for executing an operation of making the read voltage supply circuit supply the read voltage and judging a threshold voltage of the memory cell transistor, and for executing an operation of making the write voltage supply circuit supply the write voltage with decreasing voltage as the operation threshold voltage approaches the voltage corresponding to the analog data.

In addition, in accordance with the third standpoint of the present invention, an analog storage semiconductor memory according to the present invention comprises a write voltage supply circuit for supplying n types ($n \geq 2$) of write voltage Vw1, . . . , Vwn (Vw1> . . . >Vwn) to a control gate of a memory cell transistor; a read voltage supply circuit for supplying n types of read voltage Vr1, . . . , Vrn (Vr1< . . . <Vrn) to the control gate of the memory cell transistor; and a write control circuit for sequentially executing, from m=1 to m=n, the m-th write cycle where the write operation at the m-th write voltage Vwm and read operation at the m-th read voltage Vrm are repeated until the operation threshold value of the memory cell transistor exceeds the m-th read voltage Vrm.

According to these configurations, an analog value can be written by decreasing the write voltage as an operation threshold value approaching the voltage Vrn. As a result, the write accuracy of a semiconductor memory can be sufficiently high.

BRIEF DESCRIPTION OF THE DRAWINGS

The other objects and advantages of the present invention will be described with reference to the accompanying drawings.

DESCRIPTION OF THE PREFERRED EMBODIMENTS

Figure 1:
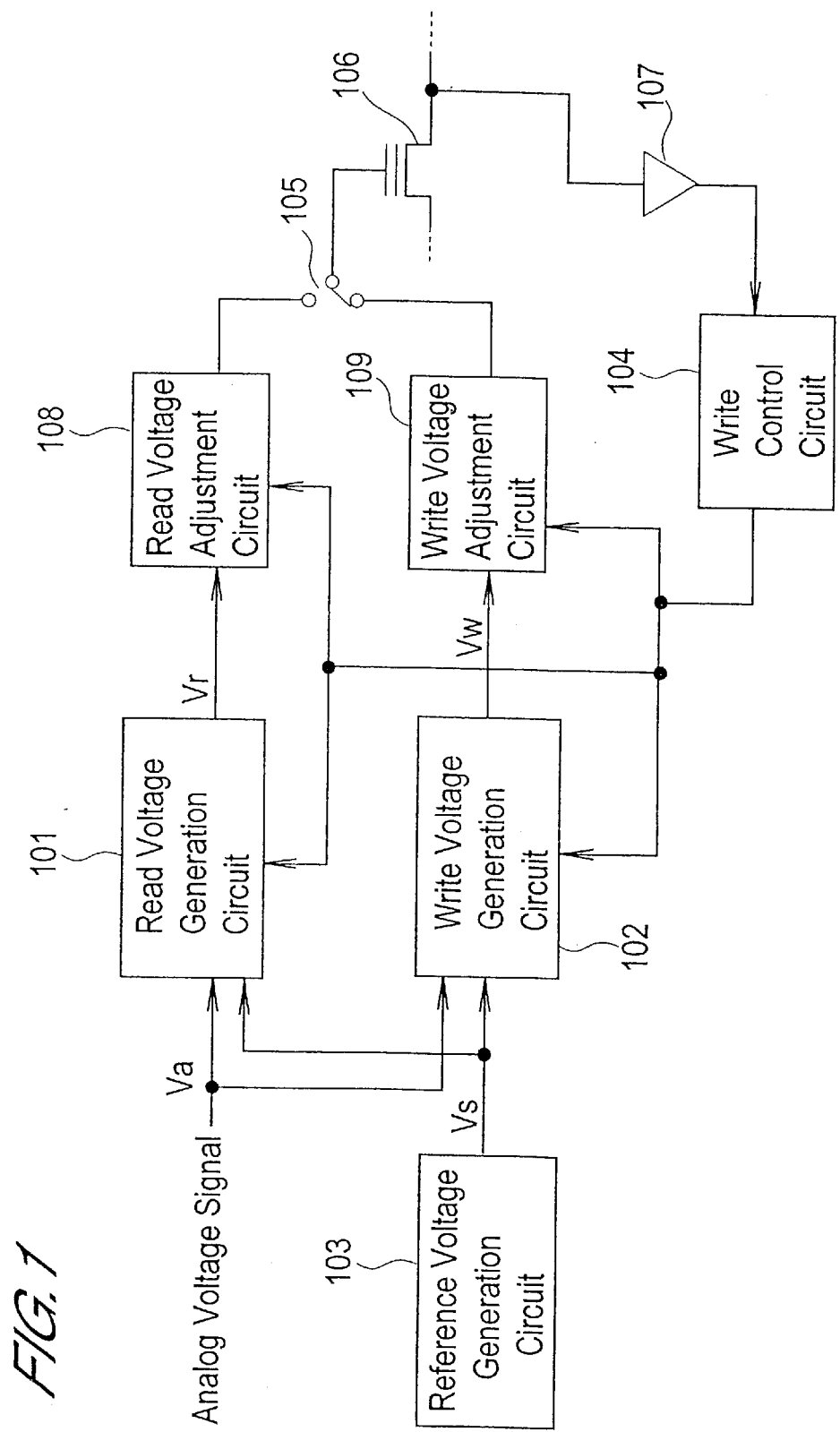
FIG. 1 is a block diagram depicting a general configuration of a semiconductor memory according to the first and third embodiments.

Embodiments of the present invention will now be described with reference to the accompanying drawings. The size, shape and positional relationship of each component in the drawings are general enough to help understand the present invention, and the numerical conditions described below are merely examples.

First Embodiment

A semiconductor memory according to the first embodiment of the present invention will be described using the case of applying the present invention to an analog storage flash memory as an example. In this embodiment, the case when the write cycle is executed, dividing into two, will be described.

FIG. 1 is a block diagram depicting a general configuration of a flash memory according to the present embodiment. In FIG. 1, only one memory cell transistor is shown, and, circuits and wires for selecting columns and rows are omitted, for simple explanation.

As FIG. 1 shows, this flash memory comprises a read voltage generation circuit 101, write voltage generation circuit 102, reference voltage generation circuit 103, write control circuit 104, switch 105, memory cell transistor 106, sense amplifier 107, read voltage adjustment circuit 108, and write voltage adjustment circuit 109.

The read voltage generation circuit 101 generates read voltage for judgment. The read voltage generation circuit 101 has input thereto an analog voltage signal Va, which indicates a write value, from the outside, and has input thereto a reference voltage Vs from the reference voltage generation circuit 103. So as to generate read voltage VR according to the write value, the read voltage generation circuit 101 shifts the level of the reference voltage Vs according to the value of the voltage signal Va, and also samples and holds the shifted voltage Vs.

The write voltage generation circuit 102 has input thereto the analog voltage signal Va, and has input thereto the reference voltage Vs from the reference voltage generation circuit 103. So as to generate write voltage Vw suitable for the write value, the write voltage generation circuit 102 shifts the level of the reference voltage Vs according to the value of the voltage signal Va, and also samples and holds the shifted voltage Vs.

The reference voltage generation circuit 103 generates reference voltage Vs, and supplies it to the read voltage generation circuit 101 and the write voltage generation circuit 102.

The write control circuit 104 judges the ON/OFF of the memory cell transistor 106 by the input voltage from the sense amplifier 107. And according to this judgment result, the write control circuit 104 controls the read voltage generation circuit 101, write voltage generation circuit 102, switch 105, read voltage adjustment circuit 108 and write voltage adjustment circuit 109. Details of the control of the write control circuit 104 will be described later.

The switch 105 applies the output voltage of the read voltage adjustment circuit 108 or the output voltage of the write voltage adjustment circuit 109 to the control gate of the memory cell transistor 106 according to the control of the write control circuit 104.

The memory cell transistor 106 is a transistor for storing analog data. The threshold value of the ON/OFF of the memory cell transistor 106 (threshold value of the voltage to be applied to the control gate) changes according to the charge amount stored in the floating gate. In other words, the memory cell transistor 106 can store analog data by setting the charge amount stored in the floating gate to be an appropriate level. When data is written, a predetermined voltage is applied between the drain and the source of the memory cell transistor 106 by a circuit, which is not illustrated here.

The sense amplifier 107 amplifies the drain potential of the memory cell transistor 106 and outputs it to the write control circuit 104.

The read voltage adjustment circuit 108 adjusts the read voltage Vr for judgment. The read voltage adjustment circuit 108 has input thereto the read voltage Vr from the read voltage generation circuit 101. Also according to the control of the write control circuit 104, the read voltage adjustment circuit 108 outputs the read voltage Vr as is, or outputs the read voltage Vr−ΔVr where a predetermined voltage ΔVr is dropped from the read voltage Vr.

The write voltage adjustment circuit 109 has input thereto the write voltage Vw from the write voltage generation circuit 102. Also according to the control of the write control circuit 104, the write voltage adjustment circuit 109 outputs the write voltage Vw as is, or outputs the write voltage Vw−ΔVw where a predetermined voltage ΔVw is dropped from the write voltage Vw.

The write operation of the flash memory shown in FIG. 1 will now be described.

When analog data is written to the flash memory, the analog voltage signal Va is input from the outside first. This voltage signal Va is input to the read voltage generation circuit 101 and the write voltage generation circuit 102. The reference voltage generation circuit 103 generates a predetermined reference voltage Vs, and supplies it to the read voltage generation circuit 101 and the write voltage generation circuit 102.

The read voltage generation circuit 101 generates the read voltage Vr from the reference voltage Vs and the voltage signal Va, as described above. The write voltage generation circuit 102, on the other hand, generates the write voltage Vw from the reference voltage Vs and the voltage signal Va, as described above.

The write control circuit 104 first executes the following first write cycle.

In the first write cycle, the write control circuit 104 causes the read voltage adjustment circuit 108 to output the read voltage Vr−ΔVr, and causes the write voltage adjustment circuit 109 to output the write voltage Vw. Then the write control circuit 104 controls the switch 105 so that the write voltage Vw is applied to the control gate of the memory cell transistor 106. As mentioned above, a predetermined voltage is applied between the drain and the source of the memory cell transistor 106. By this, the storing of charges (that is, writing) to the floating gate of the memory cell transistor 106 starts. After writing for a predetermined time, the write control circuit 104 switches the switch 105 so that the read voltage Vr−ΔVr is applied to the control gate of the memory cell transistor 106. In addition, the write control circuit 104 verifies the memory cell transistor 106. In other words, the write control circuit 104 detects the drain voltage when the read voltage Vr−ΔVr is applied to the control gate, using the sense amplifier 107, so as to judge the ON/OFF of the memory cell transistor 106.

If the memory cell transistor 106 is in ON status, the write control circuit 104 switches the switch 105 so as to start the second writing to the floating gate. After writing for a predetermined time, the write control circuit 104 verifies the memory cell transistor 106 again. The writing and verifying are repeated until the OFF status of the memory cell transistor 106 is judged by this verifying.

If it is judged that the memory cell transistor 106 is in OFF status, the write control circuit 104 executes the second write cycle.

In the second write cycle, the write control circuit 104 causes the read voltage adjustment circuit 108 to output the read voltage Vr, and causes the write voltage adjustment circuit 109 to output the write voltage Vw−ΔVw. Then the write control circuit 104 controls the switch 105 so that the write voltage Vw−ΔVw is applied to the control gate of the memory cell transistor 106. By this, writing to the memory cell transistor 106 starts. After writing for a predetermined time, the write control circuit 104 switches the switch 105 so that the read voltage Vr is applied to the control gate of the memory cell transistor 106. In addition, the write control circuit 104 verifies the memory cell transistor 106. In other words, the write control circuit 104 detects the drain voltage when the read voltage Vr is applied to the control gate using the sense amplifier 107 so as to judge the ON/OFF of the memory cell transistor 106.

If the memory cell transistor 106 is in ON status, the write control circuit 104 switches the switch 105 so as to start the second writing to the floating gate. After writing for a predetermined time, the write control circuit 104 verifies the memory cell transistor 106 again. The writing and verifying are repeated until the OFF status of the memory cell transistor 106 is judged by this verifying.

If it is judged that the memory cell transistor 106 is in OFF status, the write control circuit 104 ends the writing of the analog data to the memory cell transistor 106.

In this way, according to the flash memory of this embodiment, writing is executed with a high write voltage Vw until the ON/OFF threshold value of the memory cell transistor 106 exceeds Vr−ΔVr, and when the ON/OFF threshold value exceeds Vr−ΔVr, writing is executed with a low write voltage Vw−ΔVw. In other words, in this embodiment, writing is executed with the low write voltage Vw−ΔVw when the ON/OFF threshold value reaches a value close to Vr. If writing is executed with the write voltage Vw−ΔVw, the rise of the ON/OFF threshold value per one writing can be controlled to be low. Therefore, the actual ON/OFF threshold value does not exceed a desired setup value very much, even if the writing speed of the memory cell transistor 106 is very fast.

The values ΔVr and ΔVw are not limited, but can be determined according to the conditions of use of the flash memory.

In this embodiment, the low voltages Vr−ΔVr and Vw−ΔVw are generated by dropping the high voltages Vr and Vw generated by the circuits 101 and 102, using the circuits 108 and 109, but needless to say, a high voltage may be generated by raising the low voltage generated by the circuits 101 and 102, using the circuits 108 and 109.

Second Embodiment

A semiconductor memory according to the second embodiment of the present invention will now be described using an example when the present invention is applied to an analog storage flash memory. In this embodiment, the case when the write cycle is executed, dividing into two, will be described.

Figure 2:
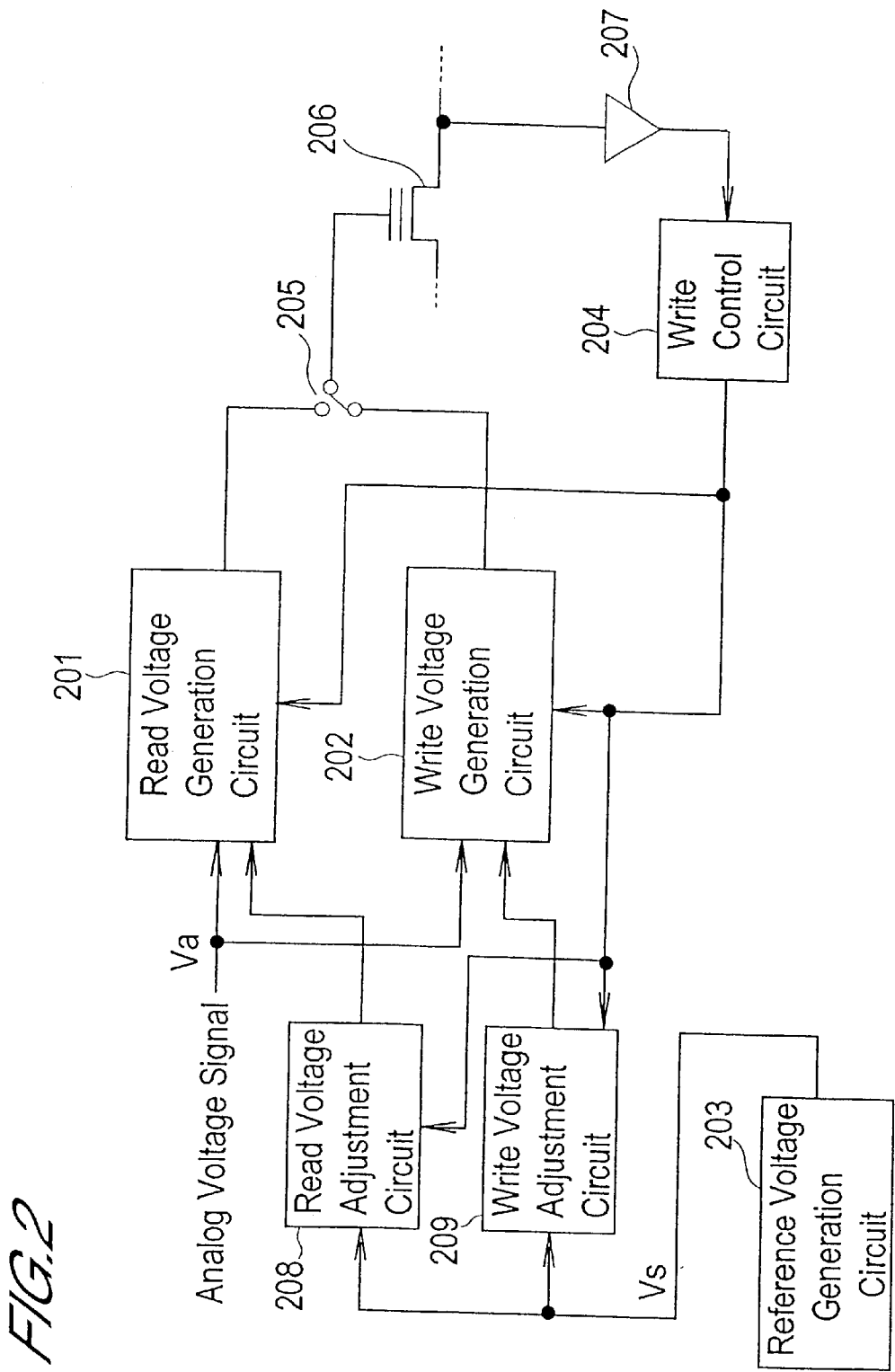
FIG. 2 is a block diagram depicting a general configuration of a semiconductor memory according to the second embodiment.

FIG. 2 is a block diagram depicting a general configuration of a flash memory according to the present embodiment. In FIG. 2, only one memory cell transistor is shown, and, circuits and wires for selecting columns and rows are omitted, for simple explanation.

As FIG. 2 shows, this flash memory comprises a read voltage generation circuit 201, write voltage generation circuit 202, reference voltage generation circuit 203, write control circuit 204, switch 205, memory cell transistor 206, sense amplifier 207, read voltage adjustment circuit 208 and write voltage adjustment circuit 209.

The read voltage generation circuit 201 has input thereto an analog voltage signal Va, which indicates a write value, from the outside, and has input thereto a reference voltage Vs or Vs−ΔVs1 (mentioned later) from the read voltage adjustment circuit 208. The read voltage generation circuit 201 shifts the level of the reference voltage Vs or Vs−ΔVs1 according to the value of the analog voltage signal Va, and also samples and holds the shifted voltage Vs or Vs−ΔVs1, so as to generate the read voltage Vr or Vr−ΔVr according to the target value of the charge storage amount.

The write voltage generation circuit 202 has input thereto the analog voltage signal Va, and has input thereto the reference voltage Vs or Vs−ΔVs2 (mentioned later) from the write voltage adjustment circuit 209. The write voltage generation circuit 202 shifts the level of the reference voltage Vs or Vs−ΔVs2 according to the value of the voltage signal Va, and also samples and holds the shifted voltage Vs or Vs−ΔVs2, so as to generate the write voltage Vw or Vw−ΔVw according to the target value of the charge storage amount.

The reference voltage generation circuit 203 generates the reference voltage Vs, and supplies it to the read voltage adjustment circuit 208 and the write voltage adjustment circuit 209.

The write control circuit 204 judges the ON/OFF of the memory cell transistor 206 by the input voltage from the sense amplifier 207. And according to this judgment result, the write control circuit 204 controls the read voltage generation circuit 201, write voltage generation circuit 202, switch 205, read voltage adjustment circuit 208 and write voltage adjustment circuit 209. Details of the control of the write control circuit 204 will be described later.

The switch 205 applies the output voltage of the read voltage generation circuit 201 or the output voltage of the write voltage generation circuit 202 to the control gate of the memory cell transistor 206 according to the control of the write control circuit 204.

The memory cell transistor 206 is a transistor for storing analog data. The threshold value of the ON/OFF of the memory cell transistor 206 (threshold value of the voltage to be applied to the control gate) changes according to the charge amount stored in the floating gate. In other words, the memory cell transistor 206 can store analog data by setting the charge amount stored in the floating gate to be an appropriate level. When data is written, a predetermined voltage is applied between the drain and the source of the memory cell transistor 206 by a circuit, which is not illustrated here.

The sense amplifier 207 amplifies the drain potential of the memory cell transistor 206 and outputs it to the write control circuit 204.

The read voltage adjustment circuit 208 has input thereto the reference voltage Vs from the reference voltage generation circuit 203. Also according to the control of the write control circuit 204, the read voltage adjustment circuit 208 outputs the reference voltage Vs as is, or outputs the reference voltage Vs−ΔVs1 where a predetermined voltage ΔVs1 is dropped from the reference voltage Vs.

The write voltage adjustment circuit 209 has input thereto the reference voltage Vs from the reference voltage generation circuit 203. Also according to the control of the write control circuit 204, the write voltage adjustment circuit 209 outputs the reference voltage Vs as is, or outputs the reference voltage Vs−ΔVs2 where a predetermined voltage ΔVs2 is dropped from the reference voltage Vs.

The write operation of the flash memory shown in FIG. 2 will now be described.

When analog data is written to the flash memory in FIG. 2, the analog voltage signal Va is input from the outside first. This voltage signal Va is input to the read voltage generation circuit 201 and the write voltage generation circuit 202. The reference voltage generation circuit 203, on the other hand, generates a predetermined reference voltage Vs and supplies it to the read voltage adjustment circuit 208 and the write voltage adjustment circuit 209.

The write control circuit 204 first executes the following first write cycle.

In the first write cycle, the write control circuit 204 causes the read voltage adjustment circuit 208 to output the reference voltage Vs−ΔVs1, and causes the write voltage adjustment circuit 209 to output the reference voltage Vs. By this, the read voltage generation circuit 201 outputs the read voltage Vr−ΔVr, and the write voltage generation circuit 202 outputs the write voltage Vw. Then the write control circuit 204 controls the switch 205 so that the write voltage Vw is applied to the control gate of the memory cell transistor 206. As mentioned above, a predetermined voltage is applied between the drain and the source of the memory cell transistor 206. By this, the storing of charges (that is, writing) to the floating gate of the memory cell transistor 206 starts. After writing for a predetermined time, the write control circuit 204 switches the switch 205 so that the read voltage Vr−ΔVr is applied to the control gate of the memory cell transistor 206. In addition, the write control circuit 204 verifies the memory cell transistor 206. In other words, the write control circuit 204 detects the drain voltage when the read voltage Vr−ΔVr is applied to the control gate using the sense amplifier 207, so as to judge the ON/OFF of the memory cell transistor 206.

If the memory cell transistor 206 is in ON status, the write control circuit 204 switches the switch 205 so as to start the second writing to the floating gate. After writing for a predetermined time, the write control circuit 204 verifies the memory cell transistor 206 again. The writing and verifying are repeated until the OFF status of the memory cell transistor 206 is judged by this verifying.

If it is judged that the memory cell transistor 206 is in OFF status, the write control circuit 204 executes the second write cycle.

In the second write cycle, the write control circuit 204 causes the read voltage adjustment circuit 208 to output the reference voltage Vs, and causes the write voltage adjustment circuit 209 to output the reference voltage Vs−ΔVs2. By this, the read voltage generation circuit, 201 outputs the read voltage Vr, and the write voltage generation circuit 202 outputs the write voltage Vw−ΔVw. Then the write control circuit 204 controls the switch 205 so that the write voltage Vw−ΔVw is applied to the control gate of the memory cell transistor 206. By this, writing to the memory cell transistor 206 starts. After writing for a predetermined time, the write control circuit 204 switches the switch 205 so that the read voltage Vr is applied to the control gate of the memory cell transistor 206. In addition, the write control circuit 204 verifies the memory cell transistor 206. In other words, the write control circuit 204 detects the drain voltage when the read voltage Vr is applied to the control gate using the sense amplifier 207, so as to judge the ON/OFF of the memory cell transistor 206.

If the memory cell transistor 206 is in ON status, the write control circuit 204 switches the switch 205 so as to start the second writing to the floating gate. After writing for a predetermined time, the write control circuit 204 verifies the memory cell transistor 206 again. The writing and verifying are repeated until the OFF status of the memory cell transistor 206 is judged by this verifying.

If it is judged that the memory cell transistor 206 is in OFF status, the write control circuit 204 ends the writing of the analog data to the memory cell transistor 206.

In this way, according to the flash memory of this embodiment, writing is executed with a high write voltage Vw until the ON/OFF threshold value of the memory cell transistor 206 exceeds Vr−ΔVr, and when the ON/OFF threshold value exceeds Vr−ΔVr, writing is executed with the low write voltage Vw−ΔVw. Therefore, for the same reason as in the first embodiment, the actual ON/OFF threshold value does not exceed a desired setup value very much, even if the writing speed of the memory cell transistor 206 is very fast.

The values ΔVs1, ΔVs2, ΔVr and ΔVw are not limited, but can be determined according to the conditions of use of the flash memory.

In this embodiment, the low voltages Vr−ΔVr and Vw−ΔVw are generated by dropping the reference voltage Vs by the circuits 208 and 209, but needless to say the high voltages Vr and Vw may be generated by raising the reference voltage Vs, which was set low, by the circuits 208 and 209.

Third Embodiment

A semiconductor memory according to the third embodiment of the present invention will now be described using an example when the present invention is applied to an analog storage flash memory. In this embodiment, the case when the write cycle is executed, dividing into three, will be described.

The configuration of the flash memory according to this embodiment is almost the same as the flash memory shown in FIG. 1.

The read voltage adjustment circuit 108 has input thereto the read voltage Vr from the read voltage generation circuit 101, and outputs one of the read voltages Vr, Vr−ΔVr1 and Vr−ΔVr2. Here Vr−ΔVr2<Vr−ΔVr1<Vr. The value of the read voltage is selected by the control of the write control circuit 104.

The write voltage adjustment circuit 109 has input thereto the write voltage Vw from the write voltage generation circuit 102, and outputs one of the write voltages Vw, Vw−ΔVw1 and Vw−ΔVw2. Here Vw>Vw−ΔVw1>Vw−ΔVw2. The value of the write voltage is selected by the control of the write control circuit 104.

The write operation of the flash memory according to this embodiment will now be explained.

When analog data is written to the flash memory in FIG. 1, the analog voltage signal Va is input from the outside first. This voltage signal Va is input to the read voltage generation circuit 101 and the write voltage generation circuit 102. The reference voltage generation circuit. 103, on the other hand, generates a predetermined reference voltage Vs, and supplies it to the read voltage generation circuit 101 and the write voltage generation circuit 102.

The read voltage generation circuit 101 generates the read voltage Vr from the reference voltage Vs and the voltage signal Va, just like the first embodiment. The write voltage generation circuit 102 also generates the write voltage Vw from the reference voltage Vs and the voltage signal Va, just like the first embodiment.

The write control circuit 104 first executes the following first write cycle.

In the first write cycle, the write control circuit 104 causes the read voltage adjustment circuit 108 to output the read voltage Vr−ΔVr2, and causes the write voltage adjustment circuit 109 to output the write voltage Vw. Then the write control circuit 104 controls the switch 105 so that the write voltage Vw is applied to the control gate of the memory cell transistor 106. Just like the first embodiment, a predetermined voltage is applied between the drain and the source of the memory cell transistor 106 during writing. By this, the storing of charges (that is, writing) to the floating gate of the memory cell transistor 106 starts. After writing for a predetermined time, the write control circuit 104 switches the switch 105 so that the read voltage Vr−ΔVr2 is applied to the control gate of the memory cell transistor 106. In addition, the write control circuit 104 verifies the memory cell transistor 106. In other words, the write control circuit 104 detects the drain voltage when the read voltage Vr−ΔVr2 is applied to the control gate using the sense amplifier 107, so as to judge the ON/OFF of the memory cell transistor 106.

If the memory cell transistor 106 is in ON status, the write control circuit 104 switches the switch 105 so as to restart the writing to the floating gate. After writing for a predetermined time, the write control circuit 104 verifies the memory cell transistor 106 again. The writing and verifying are repeated until the OFF status of the memory cell transistor 106 is judged by this verifying.

If it is judged that the memory cell transistor 106 is in OFF status, the write control circuit 104 executes the second write cycle.

In the second write cycle, the write control circuit 104 causes the read voltage adjustment circuit 108 to output the read voltage Vr−ΔVr1, and causes the write voltage adjustment circuit 109 to output the write voltage Vw−ΔVw1. Then the write control circuit 104 controls the switch 105 so as to apply the write voltage Vw−ΔVw1 to the control gate of the memory cell transistor 106. By this, writing to the memory cell transistor 106 starts. After writing for a predetermined time, the write control circuit 104 switches the switch 105 so as to apply the read voltage Vr−ΔVr1 to the control gate of the memory cell transistor 106. In addition, the write control circuit 104 verifies the memory cell transistor 106. In other words, the write control circuit 104 detects the drain voltage when the read voltage Vr−ΔVr1 is applied to the control gate using the sense amplifier 107, so as to judge the ON/OFF of the memory cell transistor 106.

If the memory cell transistor 106 is in ON status, the write control circuit 104 switches the switch 105 so as to restart writing to the floating gate. After writing for a predetermined time, the write control circuit 104 verifies the memory cell transistor 106 again. The writing and verifying are repeated until the OFF status of the memory cell transistor 106 is judged by this verifying.

If it is judged that the memory cell transistor 106 is in OFF status, the write control circuit 104 executes the third write cycle.

In the third write cycle, the write control circuit 104 causes the read voltage adjustment circuit 108 to output the read voltage Vr, and causes the write voltage adjustment circuit 109 to output the write voltage Vw−ΔVw2. Then the write control circuit 104 controls the switch 105 so as to apply the write voltage Vw−ΔVw2 to the control gate of the memory cell transistor 106. By this, writing to the memory cell transistor 106 starts. After writing for a predetermined time, the write control circuit 104 switches the switch 105 so as to apply the read voltage Vr to the control gate of the memory cell transistor 106. In addition, the write control circuit 104 verifies the memory cell transistor 106. In other words, the write control circuit 104 detects the drain voltage when the read voltage Vr is applied to the control gate using the sense amplifier 107 so as to judge the ON/OFF of the memory cell transistor 106.

If the memory cell transistor 106 is in ON status, the write control circuit 104 switches the switch 105, so as to restart writing to the floating gate. After writing for a predetermined time, the write control circuit 104 verifies the memory cell transistor 106 again. The writing and verifying are repeated until the OFF status of the memory cell transistor 106 is judged by this verifying.

If it is judged that the memory cell transistor 106 is in OFF status, the write control circuit 104 ends the writing of the analog data to the memory cell transistor 106.

In this way, according to the flash memory of this embodiment, the writing cycle is executed dividing into three. By this, write accuracy can be further improved than the case of the first embodiment.

The values ΔVr1, ΔVr2, ΔVw1 and ΔVw2 are not limited, but can be determined according to the conditions of use of the flash memory.

It is the same as the first embodiment, that high voltage may be generated by raising the low voltage, which was generated by the circuits 101 and 102, by the circuits 108 and 109.

In this embodiment, the write cycle of the flash memory shown in FIG. 1 is divided into three, but may be divided into four or more. In addition, a very high write accuracy can be also obtained when the write cycle of the flash memory shown in FIG. 2 is divided into three or four or more.

Fourth Embodiment

A semiconductor memory according to the fourth embodiment of the present invention will now be described using an example when the present invention is applied to an analog storage flash memory. The configuration of the flash memory according to this embodiment is almost the same as the flash memory shown in FIG. 1, so that description of similar aspects will be omitted for brevity.

In the first write cycle of the first embodiment, the read voltage adjustment circuit 108 outputs a read voltage Vr−ΔVr. In the second write cycle, the read voltage adjustment circuit 108 outputs read voltage Vr. In this way, the read voltage adjustment circuit 108 provides an output voltage that changes from Vr−ΔVr to Vr.

There are two ways in which the output voltage of the read voltage adjustment circuit 108 may change from Vr−ΔVr to Vr. The first way is that the read voltage adjustment circuit 108 stops the output of voltage Vr−ΔVr for the first cycle, and then subsequently starts to output voltage Vr for the second write cycle. In this manner, two different voltages are provided from read voltage adjustment circuit 108 to the control gate of memory cell transistor 106 via switch 105.

In an alternative way of changing the output voltage, the read voltage adjustment circuit 108 provides an output voltage that rises gradually from Vr−ΔVr to Vr. In other words, the output voltage from the read voltage adjustment circuit 108 rises from Vr−ΔVr to Vr continuously. In this alternative, read voltage adjustment circuit 108 does not stop providing an output voltage.

In more detail, in the above noted first way to provide changing output voltage, switch 105 is controlled to couple read voltage adjustment circuit 108 to the control gate of transistor 106 after the output voltage of read voltage adjustment circuit 108 rises completely to Vr, so that only voltages Vr−ΔVr and Vr are supplied to the control gate of transistor 106.

In contrast, in the second way of providing output voltages, switch 105 is controlled to couple read voltage adjustment circuit 108 and the control gate of transistor 106 before the output voltage of read voltage adjustment circuit 108 starts to rise. In this manner, the voltage supply to the control gate of memory cell transistor 106 from read voltage adjustment circuit 108 (that is, the read voltage) rises continuously from Vr−ΔVr to Vr gradually. In other words, switch 105 connects read voltage adjustment circuit 108 and the control gate of memory cell transistor 106 before the output voltage of read voltage adjustment circuit 108 begins to rise, so that the read voltage applied to the memory cell transistor changes continuously. Since the read voltage as output from read voltage adjustment circuit 108 changes continuously in a gradual manner, it should thus be understood that any various different read voltage values may thus be applied to the control gate of memory cell transistor 106.

As described above, according to the semiconductor memory of the present invention, a sufficient write accuracy can be obtained even if the write speed of the memory cell transistor is high due to manufacturing dispersion or other reasons.

What is claimed is:

1. An analog storage semiconductor memory comprising:
   a memory cell transistor that stores analog data;
   a write voltage supply circuit for supplying a plurality of write voltages to a control gate of said memory cell transistor;

a read voltage supply circuit for supplying a plurality of read voltages to said control gate of said memory cell transistor; and a write control circuit for executing an operation of making said read voltage supply circuit supply said read voltages and judging a threshold voltage of said memory cell transistor, and for executing an operation of making said write voltage supply circuit supply said write voltages as having decreasing voltage as said threshold voltage approaches a voltage corresponding to said analog data.

2. The analog storage semiconductor memory according to claim 1, wherein a plurality of said memory cell transistors constitute a flash memory.

3. The analog storage semiconductor memory according to claim 1, wherein said read voltage supply circuit continuously changes a value of the read voltage supplied, without stopping supply of the read voltages.

4. The analog storage semiconductor memory according to claim 3, wherein said read voltage supply circuit provides a read voltage Vr–ΔVr during a first write cycle, and provides a read voltage that continuously changes from Vr–ΔVr to Vr during a second write cycle.

5. An analog storage semiconductor memory comprising:

a write voltage supply circuit for supplying n (n≧2) write voltages Vw1, . . . , Vwn (Vw1> . . . >Vwn) to a control gate of a memory cell transistor;

a read voltage supply circuit for supplying n read voltages Vr1, . . . , Vrn (Vr1 < . . . <Vrn) to said control gate of said memory cell transistor; and a write control circuit for sequentially executing, from m=1 to m=n, an mth write cycle where a write operation at an mth write voltage Vwm and a read operation at an mth read voltage Vrm are repeated until an operation threshold value of said memory cell transistor exceeds the mth read voltage Vrm.

6. The analog storage semiconductor memory according to claim 5, wherein said write voltage supply circuit comprises:

a write voltage generation circuit for generating one of said write voltages Vw1, . . . , Vwn using an analog voltage signal; and a write voltage adjustment circuit for generating the rest of said write voltages Vw1, . . . , Vwn by dropping or raising an output voltage of said write voltage generation circuit according to a control signal which is input from said write control circuit.

7. The analog storage semiconductor memory according to claim 6, wherein said write voltage generation circuit generates the one of said write voltages Vw1 , . . . , Vwn by shifting a level of a reference voltage according to said analog voltage signal, and then samples and holds the shifted reference voltage.

8. The analog storage semiconductor memory according to claim 6, wherein said write voltage generation circuit generates said write voltage Vw1 and said write voltage adjustment circuit generates said write voltages Vw2, . . . , Vwn by dropping said write voltage Vw1.

9. The analog storage semiconductor memory according to claim 6, wherein said write voltage generation circuit generates said write voltage Vwn and said write voltage adjustment circuit generates said write voltages Vw1, . . . , Vwn–1 by raising said write voltage Vwn.

10. The analog storage semiconductor memory according to claim 5, wherein said read voltage supply circuit comprises:

a read voltage generation circuit for generating one of said read voltages Vr1, . . . , Vrn using an analog voltage signal; and a read voltage adjustment circuit for generating the rest of said read voltages Vr1, . . . , Vrn by dropping or raising an output voltage of said read voltage generation circuit according to a control signal which is input from said write control circuit.

11. The analog storage semiconductor memory according to claim 10, wherein said read voltage generation circuit generates one of said read voltages Vr1, . . . , Vrn by shifting a level of a reference voltage according to said analog voltage signal, and then samples and holds said shifted reference voltage.

12. The analog storage semiconductor memory according to claim 10, wherein said read voltage generation circuit generates said read voltage Vrn, and said read voltage adjustment circuit generates said read voltages Vr1, . . . Vrn–1 by dropping said read voltage Vrn.

13. The analog storage semiconductor memory according to claim 10, wherein said read voltage generation circuit generates said read voltage Vr1, and said read voltage adjustment circuit generates said read voltages Vr2, . . . , Vrn by raising said read voltage Vr1.

14. The analog storage semiconductor memory according to claim 5, wherein said write voltage supply circuit comprises:

a write voltage adjustment circuit for dropping or raising a reference voltage according to a control signal output from said write control circuit to provide an adjusted reference voltage; and a write voltage generation circuit for generating said write voltages Vw1, . . . , Vwn using said adjusted reference voltage.

15. The analog storage semiconductor memory according to claim 14, wherein said write voltage generation circuit generates said write voltages Vw1, . . . , Vwn by shifting a level of said adjusted reference voltage output from said write voltage adjustment circuit according to an analog voltage signal, and then samples and holds said shifted reference voltage.

16. The analog storage semiconductor memory according to claim 15, wherein said write voltage adjustment circuit generates n adjusted reference voltages Vs1, . . . , Vsn by dropping the reference voltage.

17. The analog storage semiconductor memory according to claim 15, wherein said write voltage adjustment circuit generates n adjusted reference voltages Vs1, . . . , Vsn by raising the reference voltage.

18. The analog storage semiconductor memory according to claim 5, wherein said read voltage supply circuit comprises:

a read voltage adjustment circuit for dropping or raising a reference voltage according to a control signal output from said write control circuit to provide an adjusted reference voltage; and a read voltage generation circuit for generating said read voltages Vr1, . . . , Vrn using said adjusted reference voltage.

19. The analog storage semiconductor memory according to claim 18, wherein said read voltage generation circuit generates said read voltages Vr1, . . . , Vrn by shifting a level of said adjusted reference voltage output from said read voltage adjustment circuit according to an analog voltage signal, and then samples and holds the shifted reference voltage.

20. The analog storage semiconductor memory according to claim 18, wherein said read voltage adjustment circuit generates n adjusted reference voltages Vs1, ..., Vsn by dropping the reference voltage.

21. The analog storage semiconductor memory according to claim 18, wherein said read voltage adjustment circuit generates n adjusted reference voltages Vs1, ..., Vsn by raising the reference voltage.

22. The analog storage semiconductor memory according to claim 5, wherein said write control circuit judges that the operation threshold value of said memory cell transistor exceeds the mth read voltage Vrm by detecting ON/OFF status of said memory cell transistor from a drain potential of said memory cell transistor.

23. The analog storage semiconductor memory according to claim 5, further comprising a switch for selectively supplying said write voltage or said read voltage to said control gate of said memory cell transistor under control of said write control circuit.

24. The analog storage semiconductor memory according to claim 5, wherein a plurality of said memory cell transistors constitute a flash memory.

25. The analog storage semiconductor memory according to claim 5, wherein said read voltage supply circuit continuously changes a value of the read voltage supplied, without stopping output of the read voltages.

* * * * *